United States Patent [19]

Levi

[11] Patent Number: 5,009,240

[45] Date of Patent: Apr. 23, 1991

[54] WAFER CLEANING METHOD

[75] Inventor: Mark W. Levi, Utica, N.Y.

[73] Assignee: United States of America, Washington, D.C.

[21] Appl. No.: 377,020

[22] Filed: Jul. 7, 1989

[51] Int. Cl.[5] .......................... B08B 7/00; F25D 17/02

[52] U.S. Cl. .................................. 134/7; 134/198; 51/320; 51/321; 51/322; 51/439

[58] Field of Search ........................... 134/4–7, 134/25.1, 25.4, 57 R; 51/320, 321, 322, 439; 62/64, 340, 66, 330, 331, 332, 347, 62, 63, 8; 15/320, 230

[56] References Cited

U.S. PATENT DOCUMENTS

| | | | |
|---|---|---|---|
| 4,038,786 | 8/1977 | Fong | 51/320 |
| 4,300,581 | 11/1981 | Thompson | 134/57 R |
| 4,326,553 | 4/1982 | Hall | 134/153 |
| 4,365,383 | 12/1982 | Bartlett | 15/302 |
| 4,401,131 | 8/1983 | Lawson | 134/149 |
| 4,439,243 | 3/1984 | Titus | 134/33 |
| 4,458,703 | 7/1984 | Inoue et al. | 134/57 R |
| 4,500,080 | 2/1985 | Aigo | 269/56 |
| 4,585,517 | 4/1986 | Stemple | 156/643 |
| 4,597,825 | 7/1986 | Freeouf et al. | 156/643 |
| 4,655,847 | 4/1987 | Ichinoseki et al. | 51/320 |
| 4,704,873 | 11/1987 | Imaike et al. | 62/64 |

Primary Examiner—Asok Pal

[57] ABSTRACT

A wafer cleaning system which cleans semiconductor wafers by sand blasting them with ice particles is disclosed. In this system a stream of gas is conducted by a conduit to the semiconductor wafer while a spray of water is frozen into the ice particles by a number of cooling coil systems which protrude into the conduit. After the semiconductor wafer is sandblasted with ice, any residual ice is removed simply by evaporating it. This results in a clean wafer without the contamination that can accompany chemical solvents of other semiconductor cleaning and etching systems.

6 Claims, 3 Drawing Sheets

WAFER CLEANING METHOD

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to systems for cleaning semiconductor wafers, and more specifically to a wafer cleaning method which sand blasts semiconductor layers and ohmic contact areas with particles of ice in an adjustable gas stream. Older methods for cleaning semiconductor wafers are:

1. scrubbing with brushes, generally with a fluid present;
2. use of high velocity sprays or streams of gases or other fluids;
3. chemical removal; and
4. abrasion with conventional abrasives, usually carried in a fluid.

All of these suffer from one of two problems. Either they do not remove sub-micrometer sized particles effectively, or they can add particulates themselves. Particulates of extremely small size bind very strongly to surfaces by electrostatic or capillary forces.

The task of providing on an improved method of cleaning semiconductor wafers is alleviated, to some extent, by the system disclosed in the following U.S. Patents, the disclosures of which are specifically incorporated herein by reference:

---

U.S. Pat. No. 4,744,834 issued to Hag;
U.S. Pat. No. 4,300,581 issued to Thompson;
U.S. Pat. No. 4,326,553 issued to Hall;
U.S. Pat. No. 4,401,131 issued to Lawson
U.S. Pat. No. 4,439,243 issued to Titus;
U.S. Pat. No. 4,458,703 issued to Inue et al;
U.S. Pat. No. 4,500,080 issued to Aigo;
U.S. Pat. No. 4,585,517 issued to Stemple;
U.S. Pat. No. 4,597,825 issued to Freeouf et al; and
U.S. Pat. No. 4,038,786 issued to Fong.

---

Most of the above-cited references disclose systems for cleaning or etching substrate layers in semiconductor materials. These systems include the use of chemical strippers and abrasion systems.

The Lawson reference is interesting in that it combines ultrasonic energy with a semiconductor wafer cleaning fluid. The Hall reference cleans semiconductor wafers with a jet of cleaning fluid in a vibrating stream. While these systems are exemplary in the art, the use of chemical cleaning fluids has the intrinsic potential of creating additional contamination on the semiconductor.

The Titus and Hag references also use solvents to strip resist from a semiconductor substrate. The purpose of the Titus and Hag systems is somewhat different from those of Hall and Lawson (etching rather than cleaning substrate) yet they also have the potential of creating contamination on the semiconductor surfaces they treat.

The above-cited Fong reference is not involved with semiconductors at all, but is cited because it describes a new industrial cleaning system developed by the Lockheed Aircraft Corporation. The Fong reference discloses a system that cleans articles by sandblasting them with pellets of dry ice. The advantage of dry ice is that, unlike sand, the dry ice will disappear as a gas after sand blasting.

In view of the foregoing discussion, it is apparent that there remains a need to provide an improved means for cleaning semicondutor wafers without creating additional contamination on them. The present invention is intended to satisfy that need.

SUMMARY OF THE INVENTION

The present invention includes a wafer cleaning system for cleaning a semiconductor wafer using: a source of pressurized gas, a conduit, three cooling coils, a cold water source, a spray head, and an impactor element. The source of pressurized gas is fixed to the conduit, and supplies it with a stream of pressurized gas which flows through the conduit.

The first of the three cooling coils protrudes into the conduit and cools the stream of gas to a temperature slightly below zero degrees centigrade. This pressurized stream of cold gas will freeze a spray of water into ice pellets, and conduct the ice pellets to the semiconductor in the manner discussed below.

The spray head is connected with the cold water source from which it receives a supply of pressurized supercooled water. The spray head protrudes into the conduit and releases therein spray of pressurized supercooled water into the gas stream. The mixed flow is then cooled by the second cooling coil, to harden the ice particles in the stream, and to cause water vapor to condense on them. Note that a variation in the flow rate of the gas stream will produce a variation in the size of the ice particles. Generally speaking, the faster the stream of gas is flowing, the smaller the ice particles. Therefore the flow rate of the gas stream is adjusted at the source of pressurized gas to produce the desired size of ice particles.

In one embodiment of the invention, the wafer cleaning system includes an impactor unit, a heater, and a third cooling coil. In this embodiment, the conduit turns to form a ninety degree angle at the point following the second cooling coil, and the impactor unit is positioned at the corner of the turn at a forty-five degree angle. When some of the ice particles strike the impactor unit, they are melted by the heater, and removed as a liquid through a remelt bleed orifice in the conduit.

The gas flow continues past the impactor unit through the third cooling coil, where the flow is cooled to allow the remaining ice particles to attain the desired hardness. At this point, the conduit may have a narrow throat which will increase the velocity of the flow before the sandblast the semiconductor wafer and abrading particles from it.

The method provides a means for doing improved cleaning of semiconductor wafers during the manufacture of semiconductor devices having very small feature sizes and consequent extreme sensitivity to failure induced by very small contaminants. The novelty resides in using an abrasive, ice, which can be removed easily and completely, produced with purity as good or better than any other practical abrasive, and in varying the hardness of the abrasive by controlling its temperature. A further novelty is in removing oversized abrasive particles by melting them and extracting the resulting liquid. The use of an inline particle sizer for abrasive cleaning is also new.

Alternative modes of the invention would use other fluids, or might leave out the impactor unit so that the particles go directly to the wafer.

It is an object of the invention to provide an improved means for cleaning semiconductor wafers without creating additional contamination on them.

It is the object of the invention to sandblast semiconductor wafers with a substance such as ice which will evaporate from the wafer without leaving a residue.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENTS

The present invention is a wafer cleaning system which sandblasts semiconductor wafers with particles of ice in an adjustable gas stream.

Figure 1:
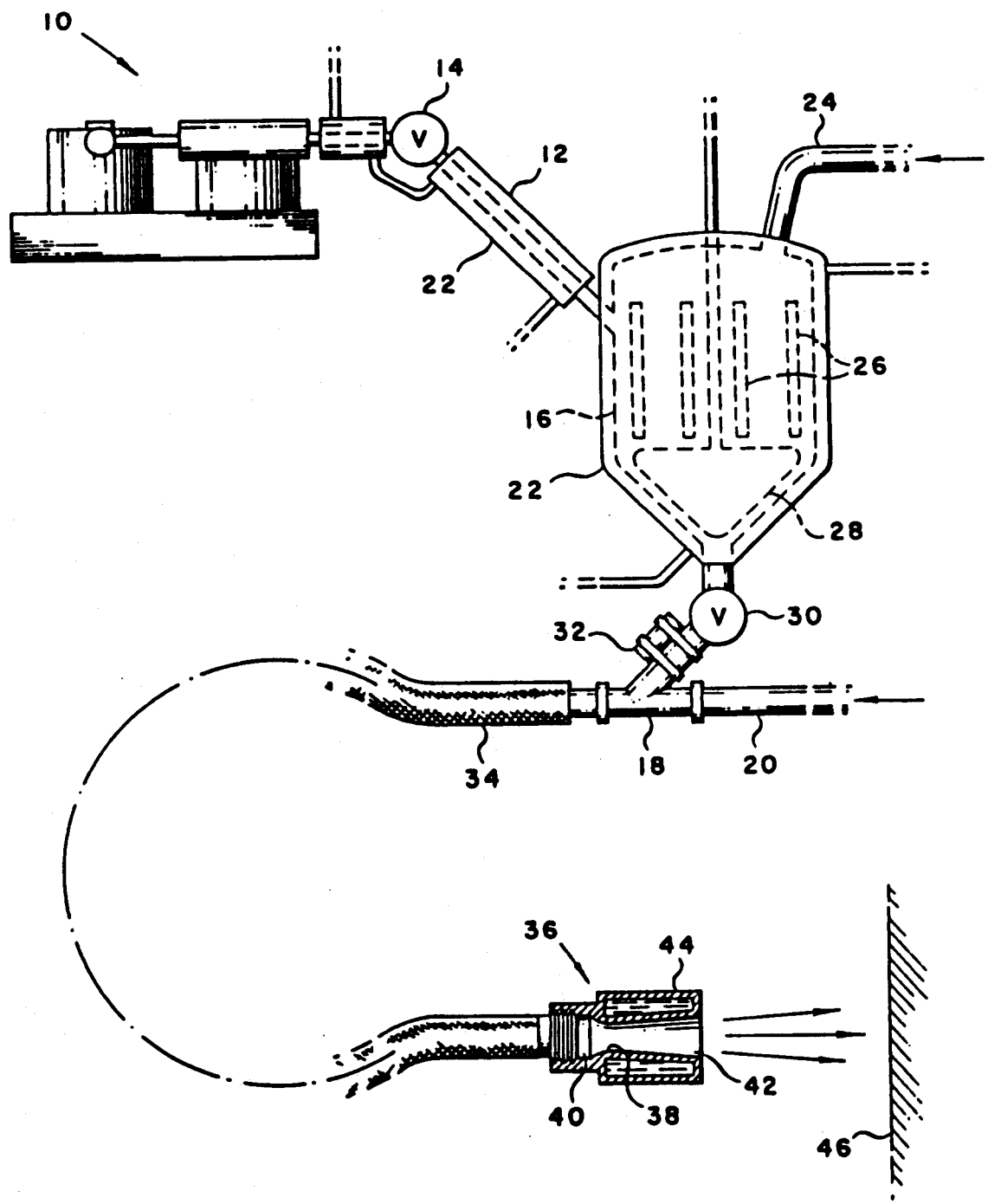
FIG. 1 is a diagram of prior art sandblasting system which uses dry ice, and which is described in the above-cited Fong patent.

The readers attention is now directed towards FIG. 1 which is a diagram of the prior art sandblasting system of the above-cited Fong patent. In FIG. 1, the pellets or particles used are solid carbon dioxide or dry ice particles produced by a known type of machine 10 for producing such pellets or particles. This machine 10 is preferably of a known type capable of producing either particles or pellets having a rounded or somewhat rounded configuration or having comparatively sharp edges and corners. When the invention is to be utilized in connection with abrading a surface or for a similar purpose it is considered that preferably such particles or pellets be formed by the machine 10 so as to have a tetrahedral shape since when particles or pellets are of such a shape they are believed to have a maximum of sharp edges and corners per unit of weight.

In the system of FIG. 1, the pellets or particles produced by the machine 10 are transferred through a conduit 12 containing a control valve 14 to a storage hopper 16 which is utilized as a surge tank from which these pellets or particles are dispensed through a Y-fitting 18 into a principal line or conduit 20. Preferably the conduit 12 should be as short as reasonably possible so that the total time that a pellet or particle will be in this conduit 12 is minimized as much as Possible. Similarly, the hopper 16 will be of a comparatively small size and will be operating so that no pellet or particle will be within this hopper 16 any longer than is reasonably necessary.

In general the sizes of the pellets or particles produced by the machine 10 should correspond to the sizes of the particles or pellets such as are employed in conventional sandblasting type operations. For the particles or pellets used to be sufficiently large so as to be effective in causing an effect on a surface as the invention is practiced, it is considered that these particles should be at least 1/16 inch (.16 cm) in their largest dimension. On the other hand, if the particles or pellets employed are greater than about 3/8 inch (0.93 cm) in their largest dimension it will be difficult to utilize such particles in practicing the Fong invention. Also such large particles, particularly when they are comparatively hard, may tend to dent a surface being treated as the process is practiced. The sizes of such particles are specified in this discussion with reference to the largest dimensions of such particles in this specification because it is normally easiest to size particles using conventional screens which effectively separate particles according to their largest dimensions.

Sublimation may be controlled by limiting what may be referred as the "dwell time" within the conduit 12 and the hopper 16 with cooling jackets 22 of conventional design which are intended to lower the temperature within the conduit 12 and the hopper 16 to well below the triple point of the material. This "triple point" is defined as the temperature and pressure at which the solid, liquid and vapor of a substance are in equilibrium one another.

Normally there will be no significant problem in keeping the temperature of particles or pellets, and in particular the temperature of dry ice particles or pellets low enough to be within the desired range. Obviously the pressure present in the hopper 16 and in the conduit 12 will be important in maintaining the particles or pellets in minimizing weight loss through sublimation. The hopper 16 is normally pressurized through the use of a gas under pressure introduced into the hopper 16 through a line 24. The pressure of such gas will normally be sufficiently adequate so as to tend to promote movement of the particles or pellets through the fitting 18 into the conduit 20. The gas used to pressurize the hopper 16 is preferably cooled to a temperature at which it will not promote sublimation by heating the particles or pellets within this hopper 16.

The movement of pellets or particles through the conduit 12 and into the hopper 16 will frequently tend to cause the generation of static charges on these pellets or particles. The development of such charges is considered to tend to promote the pellets or particles to agglomerate or join together. This is undesirable because if the pellets or particles tend to adhere to one another they will not normally move in the desired manner from the hopper 16 to the fitting 18. On occasion such adherence between the individual particles or pellets may even tend to prevent any particle any particle or pellet movement from the hopper 16 to the fitting 18.

Such static caused adherence is minimized in accordance with the Fong invention by locating within the hopper 16 (and possibly within the conduit 12) a plurality of alpha particle static eliminators 26. The precise number and locations of such eliminators 26 which are used in any installation are determined on an empirical basis. Such eliminators 26 are relatively small devices which can normally be installed with a minimum of difficulty. These devices do not require any external power source and operate effectively over a relatively prolonged period. Suitable devices of this category are commercially available and are utilized in other applications.

It is also preferred to locate within the hopper 16 a conventional mechanical agitator 28 which will continuously stir the particles or pellets within this hopper 16. The particular agitator 28 illustrated is a mechanical stirring blade of conventional design. Such a blade will constantly keep the particles or pellets in a state of agitation so as to prevent any bridging of such particles or pellets adjacent to the fitting 18 and will tend to constantly move these particles or pellets so that there will always be a supply of them ready for use adjacent to the fitting 18. If desired other agitation type devices than a stirrer can, of course, be employed.

In order to guard against the possibility of particles or pellets agglomerating within and/or forming a bridge-like structure blocking off the interior of the fitting 18 it is considered most desirable to use an agitator in connection with this fitting 18, particularly in those circumstances when a valve 30 is installed within the fitting 18 for the purpose of regulating the flow of particles or pellets through this fitting 18. Because of the nature of the normal type of fitting used as the fitting 18, a stirrer type agitator cannot be utilized in conjunction with this fitting 18. It is considered preferable to use with the fitting 18, a small vibratory agitator 32 which will constantly apply a shaking action to the fitting 18 of sufficient magnitude so as to prevent any hangup of material within this fitting 18.

The particles or pellets which pass through the fitting 18 into the conduit 20 are caught up with the stream of compressed gas moving through the conduit 20 and are agitated by the turbulence of such gas to such an extent that material hangup or agglomeration is normally not a problem after the particles and the compressed gas are mixed with one another. Normally the gas used within any of the different sublimable particles or pellets capable of being employed will be common air.

Most satisfactory results are considered to be achieved using compressed air at a pressure from about 40 to about 200 pounds per square inch. When lower pressures are used the momentum of a particle hitting against a surface will normally tend to be undesirably small to accomplish any significant affect on the surface. If on the other hand a gas at a higher pressure is used it is considered that the practice of the process will be impeded by the usual problems encountered in conveying relatively high pressure fluids. The relative quantities of particles or pellets and of compressed gas which should be used together can be varied between comparatively wide limits.

In general the rate at which pellets or particles move through the fitting 18 should be correlated with the volume of compressed gas moving through the conduit 20 so that the gas stream is not overloaded with particles or pellets. The higher the loading of such a stream of such a compressed gas with particles or pellets, the more efficient the results obtained with the invention so long as the loading is not sufficiently high so as to cause accumulations or so as to cause sufficient friction between the individual particles or pellets to prevent them from obtaining a relatively high velocity.

Figure 2:
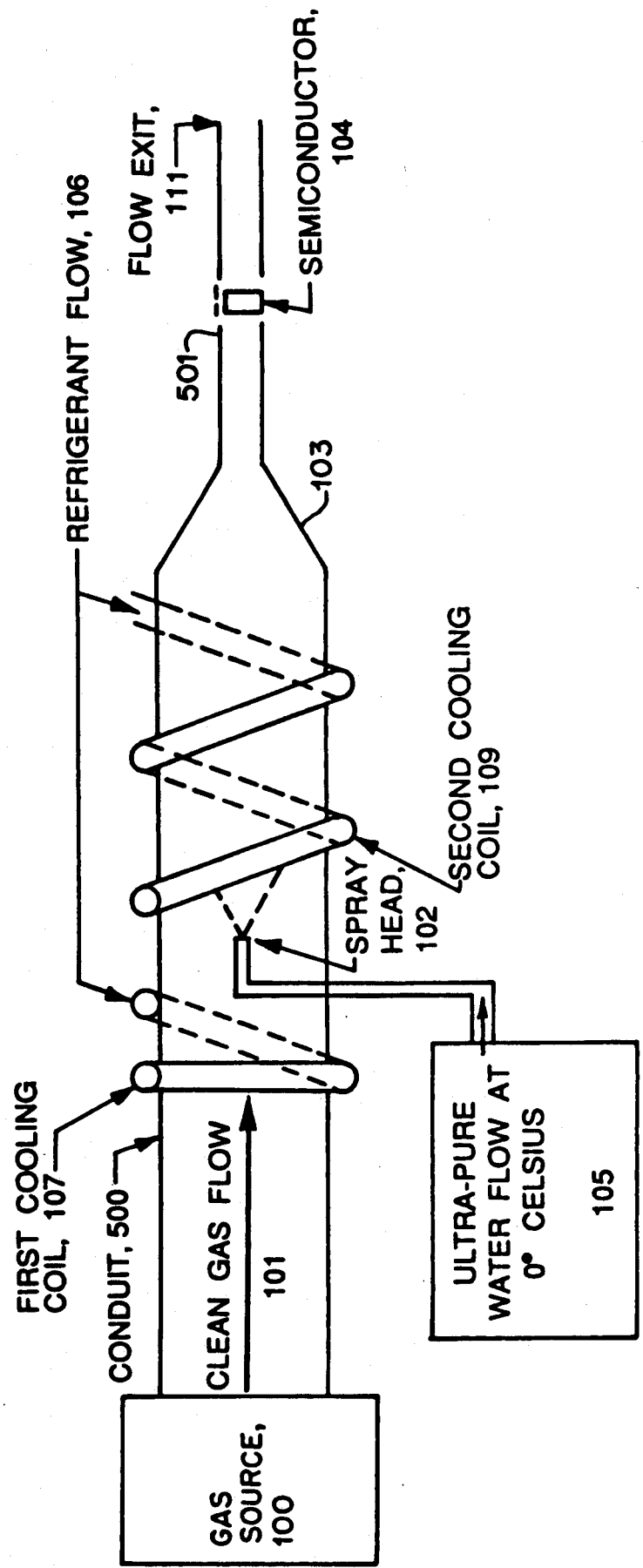
FIG. 2 is an illustration of an embodiment of the present invention.

The reader's attention is now directed towards FIG. 2, which is an illustration of an embodiment of the present invention. The system of FIG. 2 is designed to clean a semiconductor wafer 104 by sandblasting it with ice using: a pressurized gas source 100, a conduit 500, two cooling coils 107, 109, a pressurized source of cold water 105, and a spray head 102.

The pressurized gas source 100 is fixed to the conduit 500, and supplies it with a stream of pressurized gas 101 which flows into the conduit. The pressurized gas source 100 should produce the stream of gas with an adjustable flow rate, since the velocity of the gas will affect the size of the ice particles produced. Generally, the faster the stream of gas, the smaller the ice particles. The flow rate of the gas should be determined empirically by experimentally adjusting it until the particles of ice are the desired size. Examples of suitable pressurized gas sources are described in the above-cited patents, including the Fong reference, and need not be described in greater detail.

The conduit 500 conducts the stream of gas 101 to the semiconductor wafer 104, and contains a first cooling coil 107 which cools the stream of gas to a temperature slightly below zero degrees centigrade. This pressurized stream of cold gas will freeze a spray of water into ice pellets which will be used to clean the semiconductor wafer 104 by sand blasing it in the manner described below.

The spray head 102 is connected to the cold water source 105 from which it receives a supply of pressurized water. In one embodiment of the invention, the water source 105 includes a refrigeration unit which produces pressurized water which is supercooled to expedite the freezing of the spray from the spray head 102. This entails cooling the water in the water source 105 to temperatures near freezing, but care must be taken to avoid freezing of the water in the spray head itself. Control over the freezing of the spray head is maintained by two means: either adjusting the temperature of the gas stream produced by the first cooling coil 107, or adjusting the temperature of the water at the water source 105. Such refrigeration systems are believed to be known in the art and need not be described in further detail. For example, see the system describe in the Fong reference.

The principal cooling coil used to transform the spray of water from the spray head 102 into a stream of ice pellets is the second cooling coil 109. The second cooling coil 109 protrudes into the conduit 500 and cools the stream of gas to temperatures well below freezing to ensure the spray of water is frozen into ice pellets, and to harden the ice particles in the stream of gas. These cold temperatures will also cause any remaining water vapor to harden on the ice particles so that they may effectively be used to clean the semiconductor 104 by sandblasting it.

The conduit 500 includes a reducing section 103 in which the cross-section of the conduit has a reduced area. This reduced area causes the velocity of the gas stream to increase so that the ice particles may more effectively sand blast the semiconductor wafer 104.

There exist a number of alternatives which satisfy the "reducing section" function in the conduit 500. For example, the nozzle system 36 used in the above-cited Fong reference may be used to adjustably decrease the cross-section of the conduit. This has the effect of respectively increasing the velocity of the gas stream as the cross-section is decreased; and decreasing the velocity as the cross-section increased. The cross-section of the conduit may be reduced without a means adjustment if the walls of the conduit are simply narrowed as depicted in FIG. 2.

The conduit 500 is also equipped with an access slot 501 which allows the semiconductor wafer 104 to be inserted for a cleaning treatment, and removed. The ice particles of the present invention are capable of sandblasting the semiconductor wafer 104 clean, then simply evaporate from the wafer once cleaning is complete. This eliminates any residue from contaminating the wafer 104 from the cleaning process.

Figure 3:
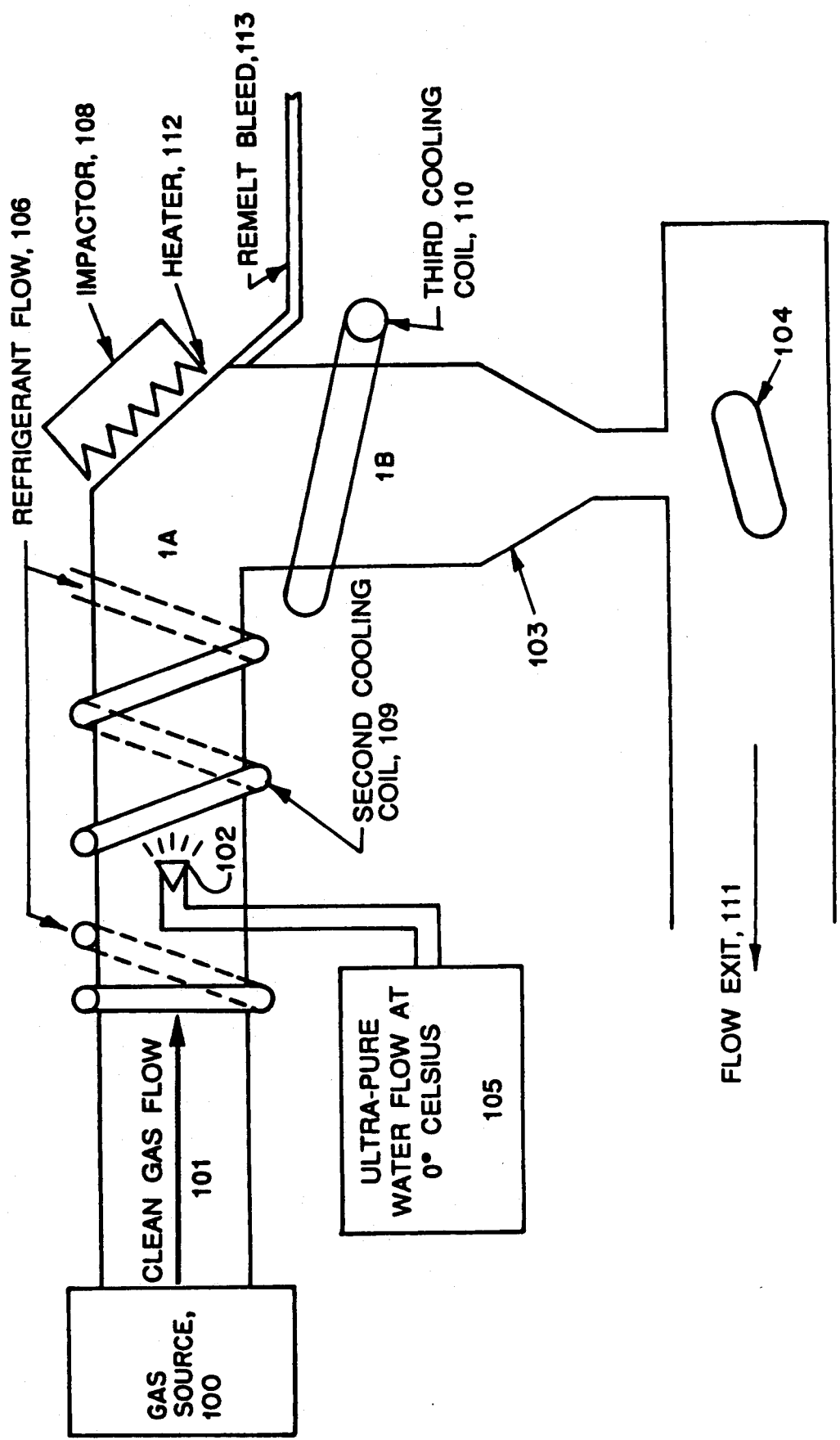
FIG. 3 is an illustration of the preferred embodiment of the present invention.

The reader's attention is now directed towards FIG. 3, which is an illustration of the preferred embodiment of the present invention. The system of FIG. 3 is designed to clean a semiconductor wafer 104 by sandblasting it with ice particles using: a pressurized gas source 100, a conduit 600, three cooling coils 107, 109, 110, a pressurized source of cold water 105, a spray head 102, an impactor unit 108, a heater element 112, and a remelt bleed tube 113.

The system of FIG. 3 has a number of elements in common with the system of FIG. 2, but to ensure their operation is understood, they are redescribed briefly here in context with their operation with the system of FIG. 3. In FIG. 3, the pressurized gas source 100 is fixed to the conduit 600, and supplies it with a stream of pressurized gas 101 which flows into the conduit. The pressurized gas source 100 should produce the stream of gas with an adjustable flow rate, since the velocity of the gas will affect the size of the ice particles produced. Generally, the faster the stream of gas, the smaller the ice particles. The flow rate of the gas should be determined empirically by experimentally adjusting it until the particles of ice are the desired size.

The conduit 600 conducts the stream of gas 101 to the semiconductor wafer 104, and contains a first cooling coil 107 which cools the stream of gas to a temperature slightly below zero degrees centigrade. This pressurized stream of cold gas will freeze a spray of water into ice pellets which will be used to clean the semiconductor wafer 104 by sandblasting it in the manner described below.

The spray head 102 is connected to the cold water source 105 from which it receives a supply of pressurized water. In one embodiment of the invention, the water source 105 includes a refrigeration unit which produces pressurized water which is supercooled to expedite the freezing of the spray from spray head 102. This entails cooling the water in the water source 105 to temperatures near freezing, but care must be taken to prevent freezing of the water in the spray head itself. Control over the freezing of the spray head is maintained by two means: either adjusting the temperature of the gas stream produced by the first cooling coil 107, or adjusting the temperature of the water at the water source 105. The principal cooling coil used to transform the spray of water from the spray head 102 into a stream of ice pellets is the second cooling coil 109 the second cooling coil 109 protrudes into the conduit 600 and cools the stream of gas to temperatures well below freezing to ensure the spray of water is frozen into ice pellets, and to harden the ice particles in the stream of gas. These cold temperatures will also cause any remaining water vapor to harden on the ice particles so that they may effectively be used to clean the semiconductor 104 by sand blasting it.

In the system of FIG. 3, the wafer cleaning system includes an impactor unit 108, a heater 112, and a third cooling coil 110. In this embodiment, the conduit 600 turns to form a ninety degree angle at the point following the second cooling coil 109, and the impactor unit 108 is positioned at the corner of the turn at a forty-five degree angle. When the larger of the ice particles strike the impactor unit 108, they are melted by the heater 112, and removed as a liquid through a remelt bleed tube 113 in the conduit 600.

The gas flow continues past the impactor unit 108 through the third cooling coil 110, where the flow is cooled to allow the remaining ice particles to attain the desired hardness. At this point, the conduit has a narrow throat which will increase the velocity of the flow and particles before they sandblast the semiconductor wafer 104.

The invention provides a means for cleaning semiconductor wafers during the manufacture of semiconductor devices having very small feature sizes and consequent extreme sensitivity to failure induced by very small contaminants. One unique feature of the invention resides in using an abrasive, ice, which can be removed easily and completely. Ice can also be produced with purity as good or better than any other practical abrasive, and with varied hardness of the abrasive by controlling its temperature.

If the system of FIGS. 2 and 3 were described as a process, they would include two basic steps. The first step entails cleaning a semiconductor wafer by sandblasting it with ice. The second step entails simply evaporating any residual ice from the semiconductor wafer to complete its cleaning without leaving any contaminating residue on the semiconductor wafer.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A semiconductor wafer cleaning system which cleans a semiconductor wafer by sandblasting the semiconductor wafer with ice particles such that when said semiconductor wafer has been cleaned, any residual ice particles may be evaporated from the semiconductor's surface without leaving any contamination on said semiconductor wafer, said semiconductor wafer cleaning system comprising:
   a source of pressurized gas which emits a stream of gas with a flow rate that is adjustable;
   a conduit which is fixed to said source of pressurized gas so that the conduit receives and conducts said stream of gas to said semiconductor wafer;
   a source of pressurized water which emits to a stream of water;
   a spray head which is connected to said source of pressurized water and which protrudes into said conduit so that the spray head receives and converts said stream of water into a spray of water which is conducted by said stream of gas through said conduit; and
   a means for cooling said spray of water to temperatures which are below a point at which water freezes, said cooling means thereby converting said spray of water into said ice particles which sandblast and clean said semiconductor wafer as they are conducted to the semiconductor wafer by said stream of gas in said conduit.

2. A semiconductor wafer cleaning system, as defined in claim 1, wherein said cooling means includes:
   a first cooling coil system which protrudes into said conduit and cools said stream of gas to a temperature which is near the point at which water freezes so that said spray of water is chilled immediately as the spray of water is emitted from said spray head, said first cooling coil system having an adjustable temperature range so that said temperature may be increased if necessary to keep water in said spray head from freezing; and
   a second cooling coil system which protrudes into said conduit at a point after said spray head emits said spray of water into said stream of gas in said conduit, said second cooling coil system chilling said spray of water such that the spray of water is converted into said ice particles which are conducted by said stream of gas through said conduit to said semiconductor wafer such that the semiconductor wafer may be sandblasted by said ice particles unit the semiconductor wafer is clean.

3. A semiconductor wafer cleaning system, as defined in claim 2, wherein said conduit includes a means for reducing said conduit's cross-sectional area, said reducing means thereby increasing the flow rate of said stream of gas so that said ice particles may effectively sandblast said semiconductor wafer.

4. A semiconductor wafer cleaning system, as defined in claim 3, further comprising:
   an impactor unit which protrudes into said conduit to intercept a portion of said ice particles so that the size of the remaining particles may be reduced to an acceptable level;
   a heater unit which is fixed to said impactor unit and, said heater unit melting only the oversize ice particles that actually strike said impactor unit to produce a stream of excess water, and
   a remelt bleed tube which is fixed to said conduit just downstream of said impactor unit and which drains off said stream of excess water produced by said heater unit when the heater unit is activated, said remelt bleed tube thereby preventing said stream of excess water from accumulating.

5. A semiconductor wafer cleaning system, as defined in claim 4, which includes a third cooling coil system which protrudes into said conduit at a point downstream from said impactor unit, heater unit and said remelt bleed tube, said third cooling coil system cooling said stream of gas to allow remaining ice particles to attain a desired hardness for sandblasting said semiconductor wafer.

6. A process for cleaning a semiconductor wafer which comprises the following steps:
   sandblasting said semiconductor wafer with ice particles to clean the semiconductor wafer; and
   evaporating any residual ice particles from said semiconductor wafer after said sandblasting step so that said semiconductor wafer is cleaned without any residual contamination forming on the semiconductor wafer from said cleaning process.

* * * * *